(12) United States Patent
Pitwon (10) Patent No.: US 7,422,374 B2
(45) Date of Patent: Sep. 9, 2008

(54) OPTICAL PRINTED CIRCUIT BOARD BLANK, A KIT AND A METHOD OF MAKING AN OPTICAL PRINTED CIRCUIT BOARD

(75) Inventor: Richard Charles Alexander Pitwon, Southsea (GB)

(73) Assignee: Xyratex Technology Limited, Hampshire (GB)

( * ) Notice: Subject to any disclaimer, the term of this patent is extended or adjusted under 35 U.S.C. 154(b) by 0 days.

(21) Appl. No.: 11/753,657

(22) Filed: May 25, 2007

(65) Prior Publication Data
US 2007/0280600 A1 Dec. 6, 2007

Related U.S. Application Data

(60) Provisional application No. 60/808,119, filed on May 25, 2006.

(51) Int. Cl.
*G02B 6/36* (2006.01)
(52) U.S. Cl. ............... 385/53; 385/14; 385/24; 385/52; 385/129; 385/130; 385/132
(58) Field of Classification Search ............... 385/14, 385/24, 52, 53, 129, 130, 131, 132
See application file for complete search history.

(56) References Cited

U.S. PATENT DOCUMENTS

| | | | |
|---|---|---|---|
| 4,732,446 A * | 3/1988 | Gipson et al. ............ | 385/24 |
| 4,735,677 A | 4/1988 | Kawachi | |
| 6,257,771 B1 | 7/2001 | Okayasu | |
| 2002/0024025 A1 | 2/2002 | Watanabe | |
| 2005/0176161 A1 | 8/2005 | Bapst | |
| 2006/0056765 A1 | 3/2006 | Hwang | |

OTHER PUBLICATIONS

Kobayashi et al., "Hybrid Optical Integration Technology," Electronics and Communications in Japan, Part 2, vol. 77, No. 10, May 1994, pp. 67-81.
International Search Report in related foreign application, Apr. 19, 2007, 1 page.

* cited by examiner

*Primary Examiner*—Frank G Font
*Assistant Examiner*—Michael P Mooney
(74) *Attorney, Agent, or Firm*—Pillsbury Winthrop Shaw Pittman LLP (57) ABSTRACT

The present invention provides an optical printed circuit board blank, comprising, a support layer; one or more optical waveguides formed thereon; and at least one socket for receiving an optical component, the socket including one or more alignment features to ensure alignment of an input/output interface of the said optical component when arranged in the socket with an input/output interface of the at least one waveguide; and a flexible optical connector arranged at an edge of the circuit board, the optical connector being optically connected to the or each of the sockets, to enable optical communication between an optical component located within the or each of the sockets and the optical connector.

12 Claims, 15 Drawing Sheets

Fig. 7

OPTICAL PRINTED CIRCUIT BOARD BLANK, A KIT AND A METHOD OF MAKING AN OPTICAL PRINTED CIRCUIT BOARD

CROSS REFERENCE TO RELATED APPLICATIONS

This application claims the benefit of priority of provisional application Ser. No. 60/808,119, filed May 25, 2006, the entire contents of which are incorporated by reference herein.

The present invention relates to an optical printed circuit board blank, a kit and a method of making an optical printed circuit board An optical printed circuit board typically comprises a support layer formed of PCB support material such as FR4 together with one or more conductive layers such as copper for defining conductive paths on the circuit board. Arranged on top of the conductive layers and the FR4 layers is a layer of optical waveguides, typically formed of a lower cladding layer, a waveguide core layer arranged on the lower cladding layer and, a patterned upper cladding layer arranged on top of the core layer so as to define one or more optical waveguides.

Figure 1A:
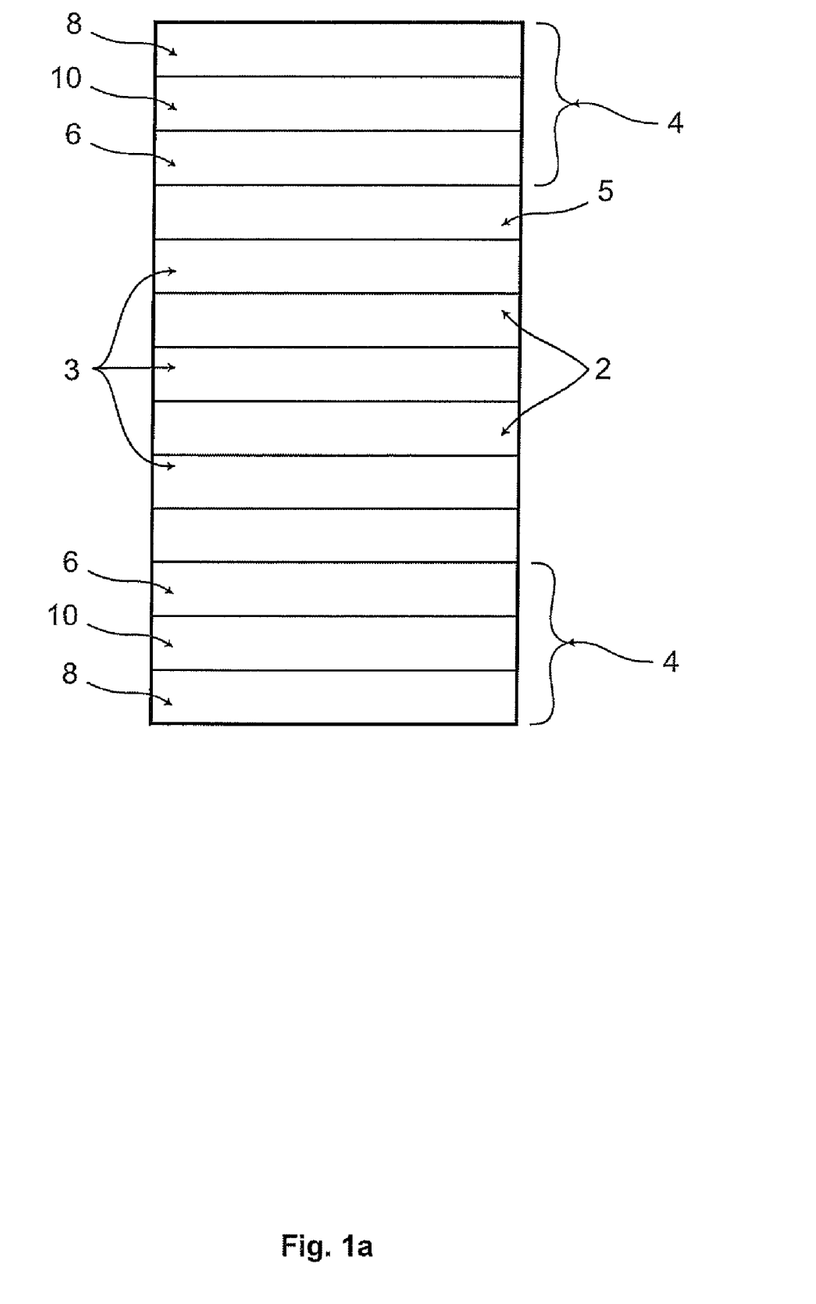
FIG. 1A shows a section through an example of an optical printed circuit board.

FIG. 1A shows a schematic representation of such an arrangement. As explained above, the optical circuit board comprises a number of FR4 layers 2, a number of conductive layers 3 such as copper layers, and an optical layer 4 formed from a lower cladding layer 6, an upper cladding layer 8 with an optical core layer 10 arranged therebetween. In the example shown in FIG. 1A, an optical layer is provided on both sides of the optical circuit board, i.e. on the top and bottom side of the structure as shown. It is possible that an optical layer is only provided on one of the sides of the optical circuit board.

Typically, when an optical printed circuit board is made, a number of passive and/or active optical components are arranged at various positions on the optical printed circuit board, connected to each other by patterned waveguides formed from the optical layer.

Figure 2:
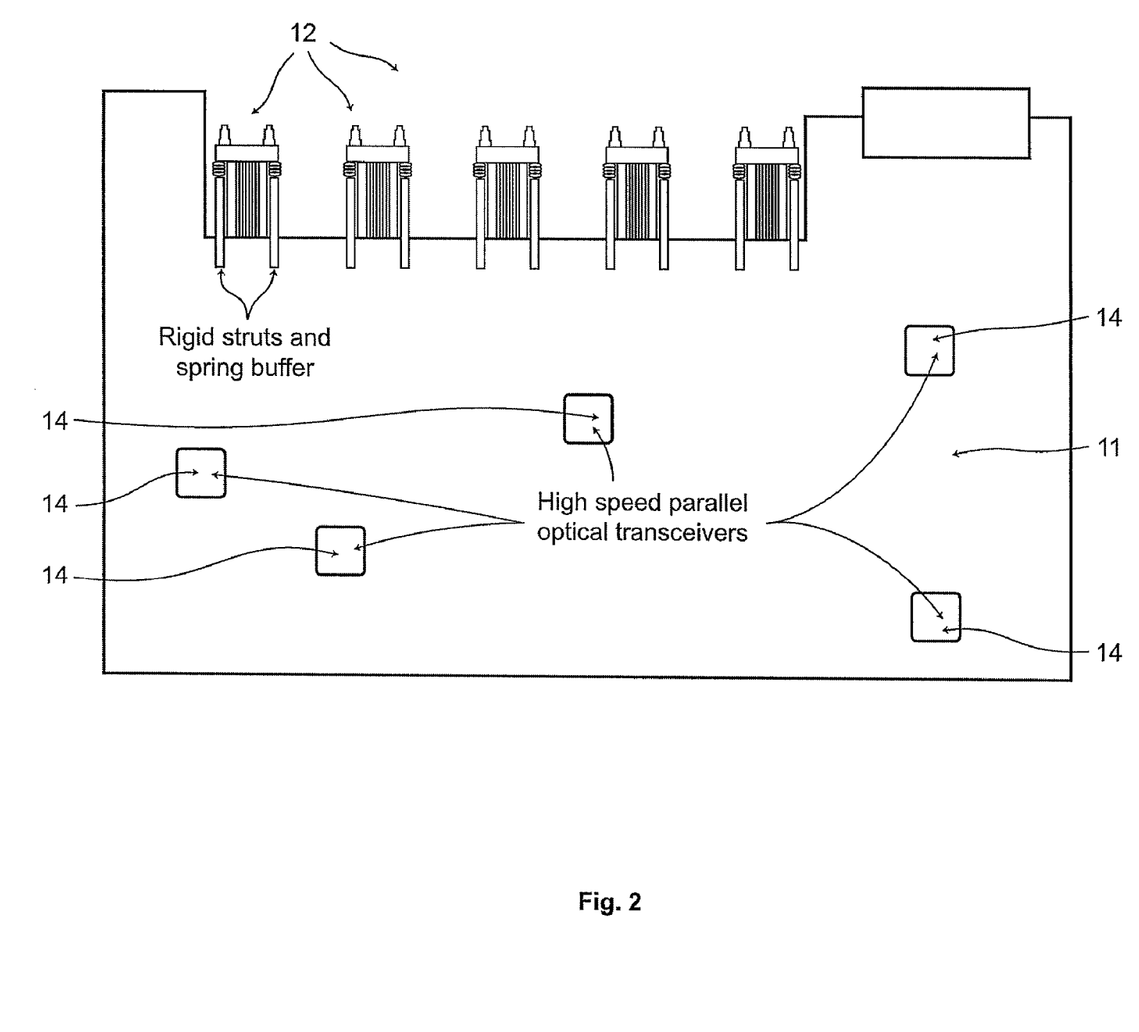
FIG. 2 shows a plan view of an example of an optical printed circuit board.

FIG. 2 shows a plan view of a schematic representation of an optical printed circuit board. In the example shown, plural flexible passive optical connectors 12 are shown for connecting the optical printed circuit board 11 to another optical printed circuit board, i.e. such as an optical backplane. The circuit board 11 shown in FIG. 2 comprises a number of high speed parallel optical transceivers 14 arranged at locations on the circuit board 11. Although not shown, a pattern of optical connectors as described above with reference to FIG. 1, is provided to enable optical communication between the high speed parallel optical transceivers. In addition, also not shown, there are provided optical waveguides for connecting the high speed parallel optical transceivers with one or more of the connectors 12.

When manufacturing such a circuit board, it is important to ensure that the alignment between input/output optical interfaces of the high speed parallel optical transceivers and input/output interfaces with the optical waveguides are in accurate registration. Otherwise, light would be lost and signal quality degraded. In certain cases, data could be lost. Therefore, the transceivers 14 must be very accurately aligned with the input interfaces of the optical waveguides. Typically, the alignment tolerance is of the order of 20 microns for multimode waveguides. When manufacturing such a circuit board, the required or desired functionality of the circuit board is considered and then the appropriate high speed parallel optical transceivers and/or passive optical devices are selected accordingly. The required pattern or patterns of optical waveguides and electrical conductors are then laid down.

The passive or active optical devices are then carefully and accurately located on the circuit board and permanently fixed there. Conventional methods are used to align the optical devices with the input/output optical interfaces of the optical waveguides on the circuit board. This means that manufacturing an optical circuit board is a difficult and expensive process as firstly for each function a specific circuit board must be designed and manufactured in terms of the optical components used and the patterns of optical waveguides etc. Secondly alignment of the optical devices with the input/output interfaces of the optical waveguides is difficult.

According to a first aspect of the present invention there is provided an optical printed circuit board blank, comprising, a support layer; one or more optical waveguides formed thereon; and at least one socket for receiving an optical component, the socket including one or more alignment features to ensure alignment of an input/output interface of the said optical component when arranged in the socket with an input/output interface of the at least one waveguide; and a flexible optical connector arranged at an edge of the circuit board, the optical connector being optically connected to the or each of the sockets, to enable optical communication between an optical component located within the or each of the sockets and the optical connector.

An optical printed circuit board blank is provided, thus enabling the simple formation of a functional optical printed circuit board which is configurable on-the-fly in that any particular optical devices may be selected in accordance with the desired function of the circuit board. In other words, a single common basic structure may be used for the blank and may then be customised by the selection and positioning of required optical devices.

Therefore, in contrast to conventional manufacturing processes whereby the function of the optical circuit board must be known prior to the manufacture, in accordance with the optical printed circuit board blank of the present invention, the eventual function of the circuit board formed from the blank is substantially irrelevant to the manufacturing process. All that matters is that optical waveguides are provided on the blank for connecting the sockets on the circuit board blank and then the functionality of the circuit board can essentially be determined by particular selection of optical devices.

Examples of suitable components for insertion into the sockets within the circuit board blank include anything that may function as a waveguide junction point. Examples include optical splitters, optical passive routers, optical active routers such as MEMS or MOEMS switches, and optical wavelength multiplexers and demultiplexers.

Preferably, the one or more alignment features is or are formed to guide an optical device into a desired position on the optical printed circuit board. In a particularly preferred example the one or more alignment features have sides that slope or are inclined with respect to a perpendicular to the surface on which they are formed. This ensures that the circuit board bank can be used manually to form an optical printed circuit board as no great precision is required but high precision is achieved at low cost manually by using the waveguide registration features as mechanical registration points to accurately locate an optical device on the circuit board. Rather a user must simply ensure that when adding an optical device to the circuit board, the lowermost surface of the optical device is within the uppermost boundary defined by the alignment features. Then, via engagement with the sides of the alignment feature or features, the optical device will be accurately positioned on the optical printed circuit board.

According to a second aspect of the present invention there is provided a method of making an optical printed circuit board, the method comprising: providing an optical printed circuit board blank according to the first aspect of the present invention; selecting optical components for insertion in the or each of the sockets in accordance with desired functionality of the optical circuit board; and positioning the or each of the optical components in a respective socket and aligning the components using alignment features within the socket.

Examples of the present invention will now be described in detail with reference to the accompanying drawings, in which.

FIG. 1A shows a section through an example of an optical printed circuit board. The circuit board comprises a support layer composed of a number (two in this particular example) of FR4 layers 2 interspaced with plural conductive layers 3, in this case copper layers. Arranged on the top surface of the circuit board as shown in FIG. 1, there is provided a flexible polymer layer such as a polyimide flex 5 with an optical layer 4 arranged thereon.

The optical layer comprises a lower cladding layer 6 and an upper cladding layer 8 with an optical core layer 10 arranged therebetween. A similar construction is provided on the underside of the circuit board shown in FIG. 1. One or more waveguides are formed from the optical layer 4 which is patterned in a desired manner to provide one or more optical waveguides on the optical circuit board for providing routes for optical signals between locations on the circuit board. The example shown in FIG. 1 is merely exemplary and other layered structures may be used for the optical circuit board.

Figure 1B:
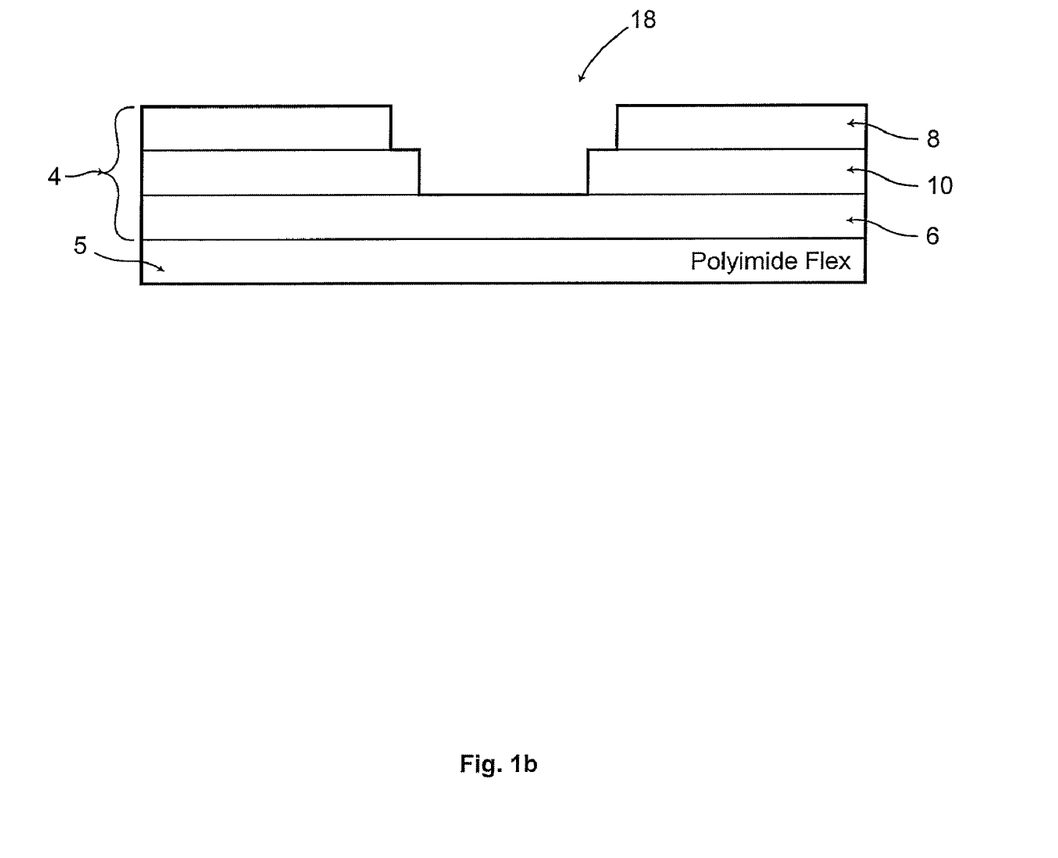
FIG. 1B shows a schematic representation of a section through an optical printed circuit board blank.

FIG. 1B shows a section through part of an optical printed circuit board blank. The Figure does not include the FR4 support layers and the copper layers 2 and 3 shown in FIG. 1A. The blank comprises one or more sockets 18 for receiving an optical device (not shown). The component of FIG. 1B in common with those of FIG. 1A are numbered in the same way. The socket 18 includes alignment features (not shown in FIG. 1B but seen clearly in FIGS. 5A to 5D) for ensuring accurate alignment and registration of an optical device arranged within the socket with the input/output optical interface of the waveguide 10. Thus, a simple and robust method for forming an optical printed circuit board is provided. A user simply requires the blank together with one or more selected optical devices. The optical devices may then be placed manually within the sockets 18 of the blank thereby to form the optical printed circuit board.

Typically, in one example, the devices would be fixed to the board with an optical index matching glue to create a seamless optical connection between the channel interface points of the optical devices and the waveguides in the board.

Referring to FIG. 2, a plan view is shown of an optical circuit board 11. The optical circuit board comprises plural optical connectors 12 for enabling connection of the circuit board 11 with another circuit board (not shown). The connectors 12 may be of the type disclosed in our co-pending patent application filed on 31st Mar. 2006, invented by Richard Charles Alexander Pitwon, entitled An Optical Circuit Board, an Optical Backplane and an Optical Communication System having attorney reference numbers P10618US and/or 11765/350587. The entire contents of this application are hereby incorporated by reference.

Referring to the circuit board shown in FIG. 2, plural high speed parallel optical transceivers 14 are provided connected to the optical circuit board at predetermined locations, defined by sockets formed within the circuit board blank, as will be explained in greater detail below with reference to FIGS. 3 and 4. The high speed parallel optical transceivers 14 are examples of optical devices for use in forming the optical printed circuit board. Active or passive optical devices may be used.

The circuit board is formed in such a manner that the sockets (not shown in FIG. 2) include alignment features to enable simple, reliable and accurate positioning of optical devices within the sockets. This enables the functionality of the circuit board to be easily determined and/or changed. In particular, it enables the functionality of the circuit board to be identified at a date after the initial manufacture of the circuit board. Thus, by manufacturing a circuit board blank having plural sockets, a user can selectively configure a functional optical circuit board at a later date to provide the desired functionality.

Therefore, manufacturing of optical printed circuit boards is significantly simplified as a different process is not required for the manufacture of each and every circuit board. Rather, a single process is required to manufacture the circuit board blanks and the precise configuration of the circuit board and the incorporation of the required functionality can be achieved at a later date by a user. The sockets define waveguide junction points in that two or more waveguides typically have an optical interface at the socket and selection of the optical device positioned in the socket after manufacture of the circuit board blank will determine the functionality of the optical printed circuit board.

Figure 3A:
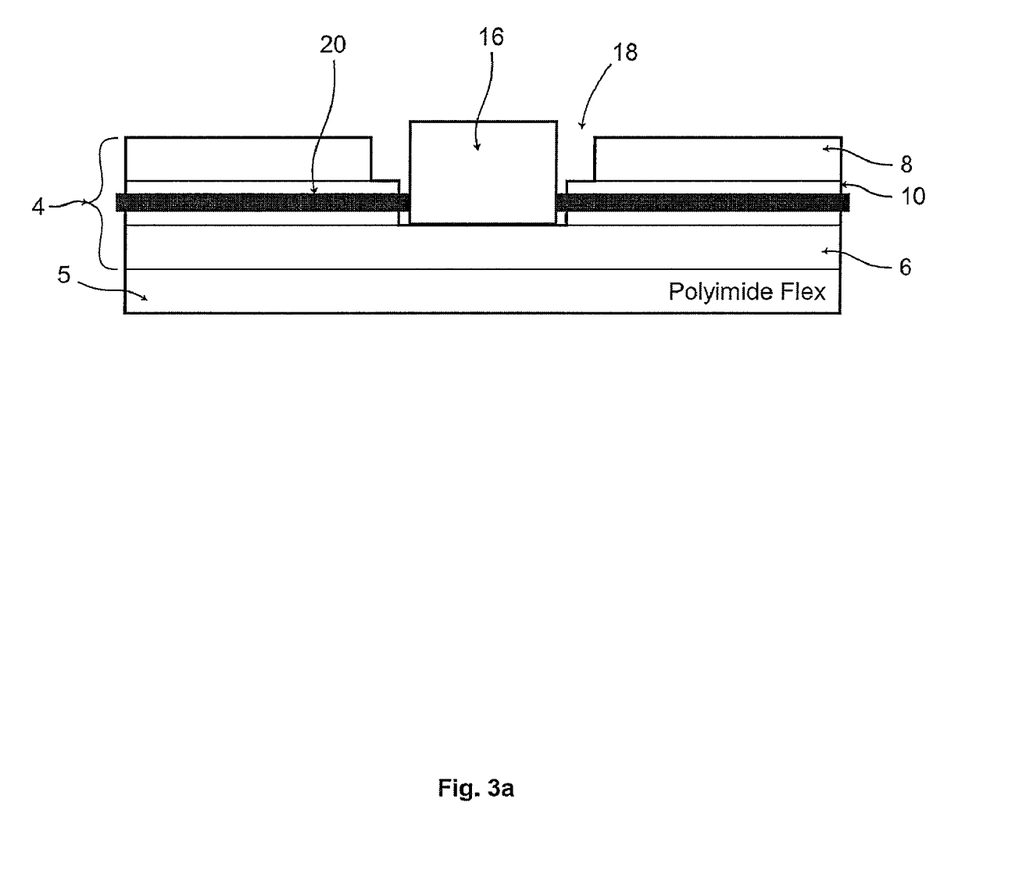
FIGS. 3a and 3b show respectively a section through an optical printed circuit board and a plan view of an optical printed circuit board.
Figure 3B:
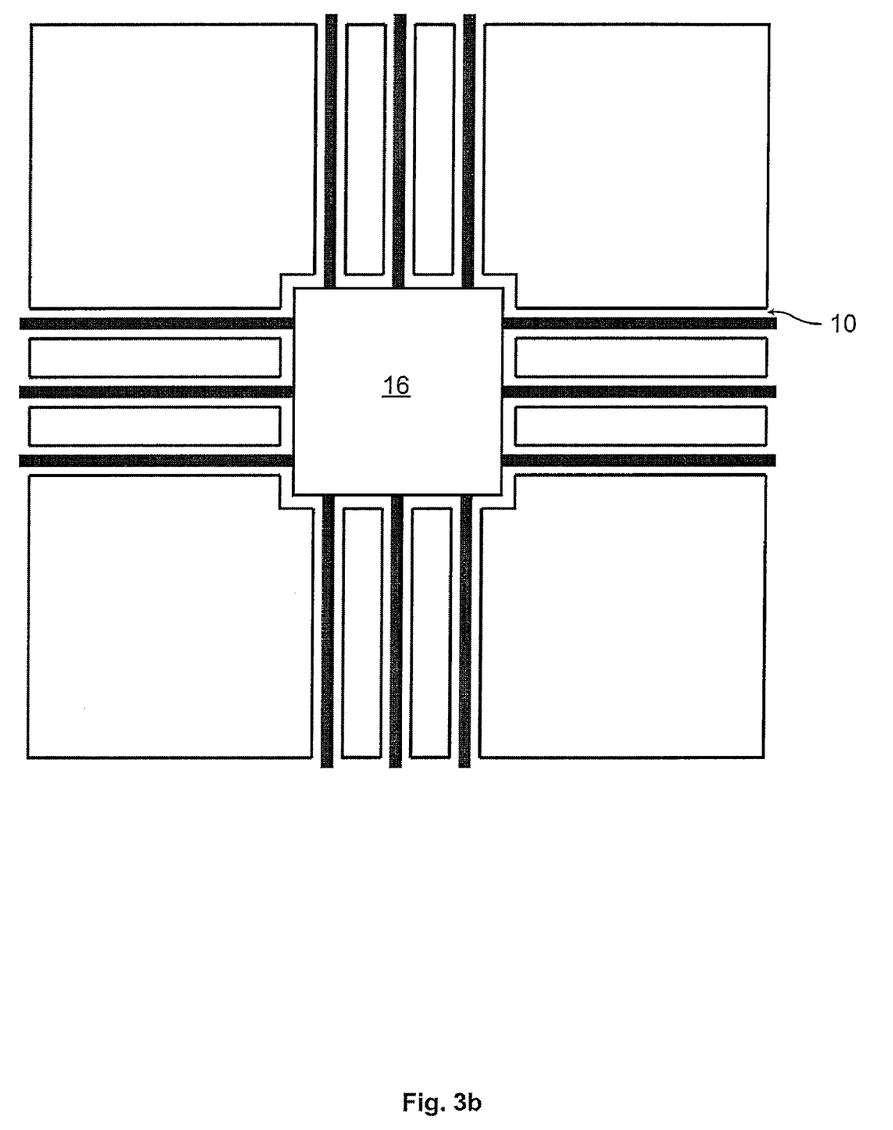

FIGS. 3A and 3B respectively show a section 3 and a plan view of a schematic representation of parts of an optical printed circuit board according to the present invention. In particular, FIGS. 3A and 3B show a schematic representation of a waveguide junction point on a printed circuit board as shown in FIGS. 1B and 2.

Referring to FIG. 3A it will be appreciated that some of the layers of the circuit board are not shown. The circuit board in FIG. 3A comprises a polyimide flexible support layer 5 as an example, but could also be a rigid support layer such as FR4 or some other known rigid PCB material having an optical layer 4 arranged thereon. The optical layer 4 comprises upper and lower cladding layers, 6 and 8 respectively, with an optical core layer 10 forming a waveguide between the upper and lower cladding layers 6 and 8. An optical device 16 is shown arranged within socket 18 on the optical printed circuit board. Optical signals 20 are shown schematically passing to and from the optical device 16 along the waveguides 10.

FIG. 3B shows a plan view of the arrangement in FIG. 3A. As can be seen, the optical device 16 is in optical communication with each of the optical waveguides 10. Therefore, by suitable selection of the optical device 16, a desired functionality for the circuit board can be achieved. For example, it could be that connection between a desired pair of the optical waveguides 10 in FIG. 3b is required and so the optical device 16 would be selected to provide this functionality.

Before positioning of the optical device 16 within the socket 18, the eventual functionality of the optical printed circuit board is not yet determined. Thus, the optical printed circuit board can be configured on-the-fly in that a common blank can be used to form an optical printed circuit board having a specific desired functionality. Separate manufacturing processes are not therefore required for optical printed circuit boards having different functionalities and therefore the cost of manufacture and complexity of manufacture of such optical printed circuit boards is reduced.

Figure 4A:
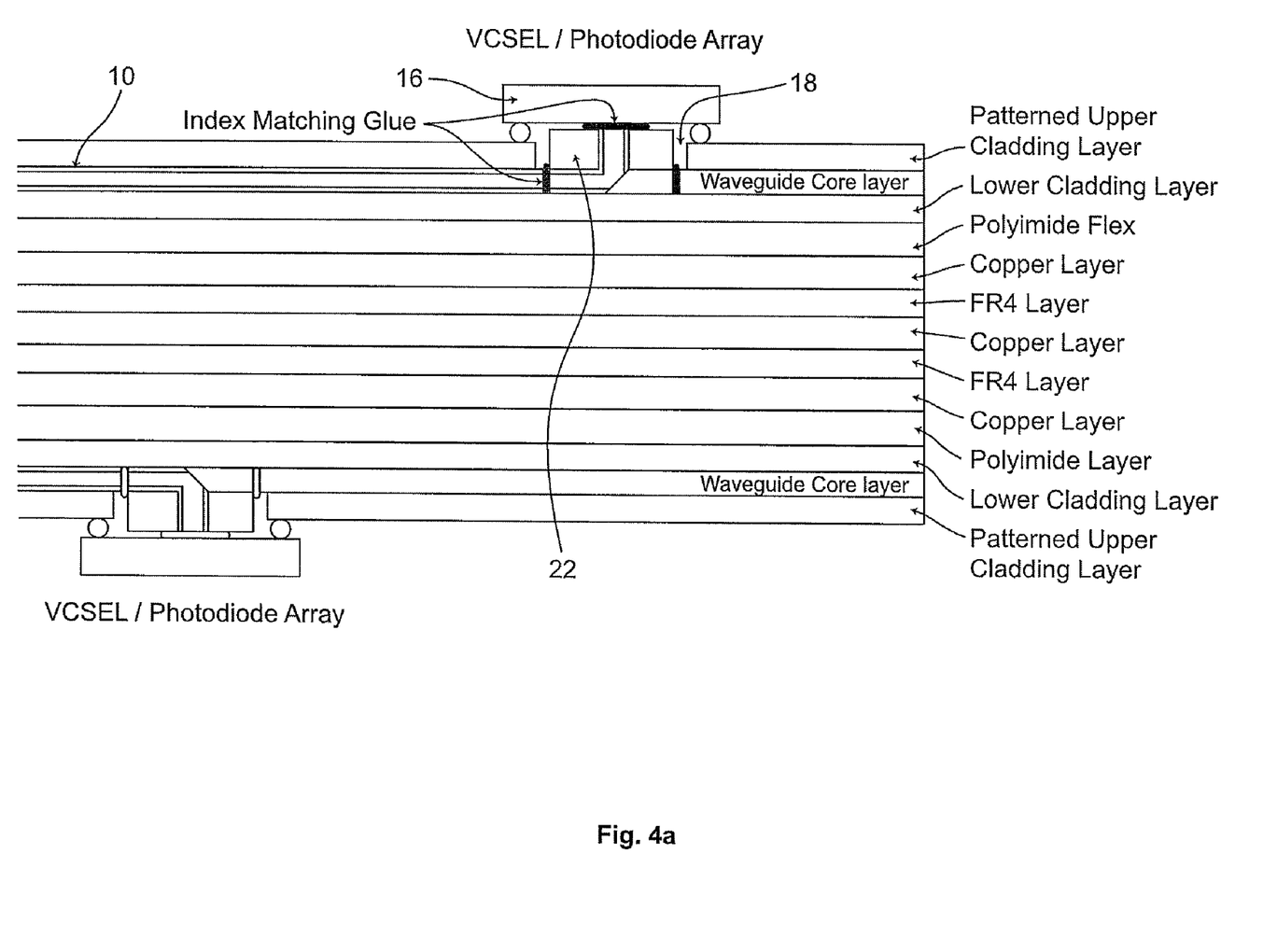
FIG. 4 shows a more detailed schematic section through an optical printed circuit board.

FIG. 4A shows a more detailed schematic section through an optical printed circuit board. A socket 18 is provided on the upper surface of the circuit board and an optical device 16 is provided therein. In the example shown in FIG. 4A, the optical device 16 is a vertical cavity surface emitting laser (VCSEL) or photodiode array. The optical device 16 comprises both the VCSEL or photodiode array and a passive optical device 22 which is the part of the optical device 16 that is actually aligned with the waveguide 10 within the optical circuit board.

Figure 4B:
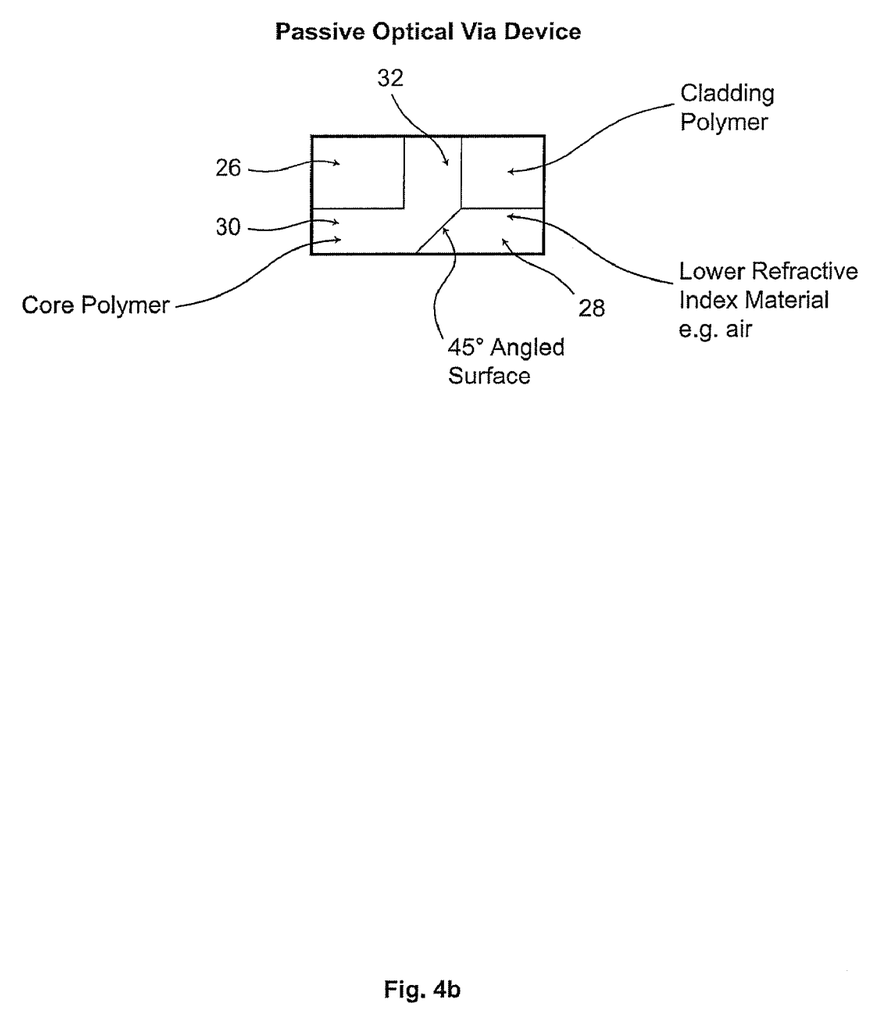

The passive optical via 22 is shown more clearly in FIG. 4B. The device 22 comprises a region of core polymer formed of the same material from which the waveguide 10 is formed and a region 26 formed of a cladding material such as that used to form the upper and lower cladding layers of the optical layer of the circuit board. Last, a region of lower refractive index material, e.g. air is provided 28. The passive optical device 22 comprises a 45° angled surface for passively routing optical signals from one end 30 of the core polymer component of the device 22 to a second end 32. The first end 30 is arranged in accurate alignment with the optical input/output interface of the waveguide 10. This is one example of a type of optical device for turning ingress light at right angles (90°) or some other angle for outputting as egress light. Various devices are available and known for achieving this in different ways. Such devices may be referred to as optical axis converters.

Figure 4C:
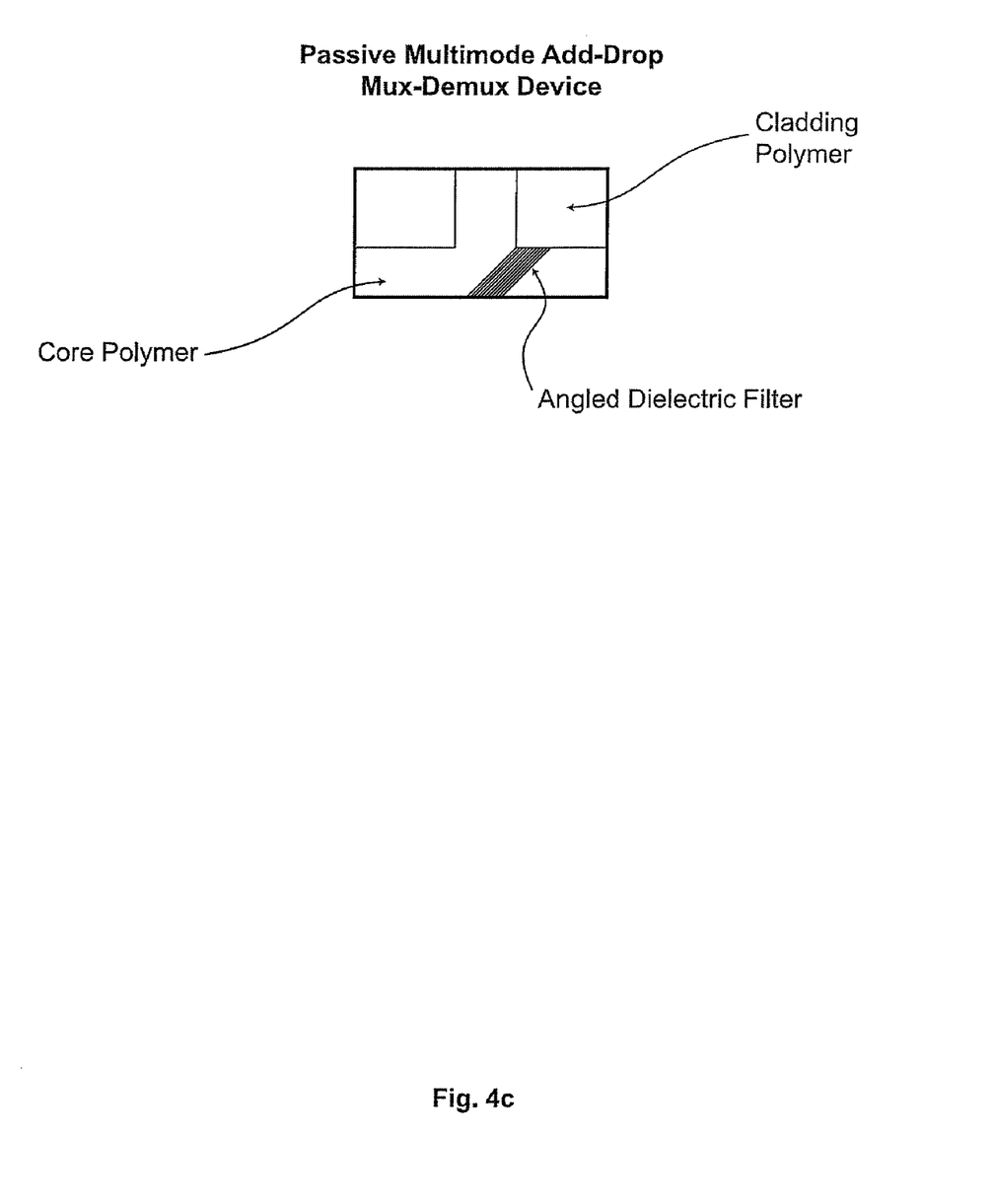

FIG. 4C shows an example of another passive optical device for arrangement in the socket 18. In this example, the device is a passive multimode add-drop multiplex/demultiplex device. The construction of the device is similar to the passive device shown in FIG. 4b, except that instead of a 45% angled surface and a lower refractive index region 28 an angled dielectric filter is provided. Thus, the passive device of FIG. 4C functions as a multimode add-drop multiplex/demuliplex device. The device shown would function both to multiplex and demultiplex optical signals and redirect them at 90°. This is only one example. Other examples could of course just multiplex/demultiplex optical signals in the same plane i.e. not deflect them at 90° but simply interface between waveguides on either side of the junction point, thereby providing the adding the functionality in the plane. Redirection at angles other than 90° is of course also possible.

Referring to FIG. 4A, once the passive optical via device 22 has been positioned within the socket 18, an active VCSEL photodiode array may be provided in optical communication with the passive optical via device 22. Alternatively, the VCSEL device may be an integrated part of the optical device, i.e. the optical device may include both the passive device 22 and the active VCSEL device. In this case, alignment between the passive device 22 and the VCSEL device presents no problems during board assembly.

It will be appreciated that by providing sockets 18 within the optical printed circuit board blank, the functionality of the optical printed circuit board can be configured on-the-fly in such a way that the actual functionality of the circuit board does not need to be determined until final assembly of the circuit board, as opposed to during the manufacturing process when the waveguides and other optical layers are laid down. Therefore, the manufacture of the optical circuit board is simplified and a versatile and convenient method for manufacturing an optical printed circuit board is provided.

Figure 5A:
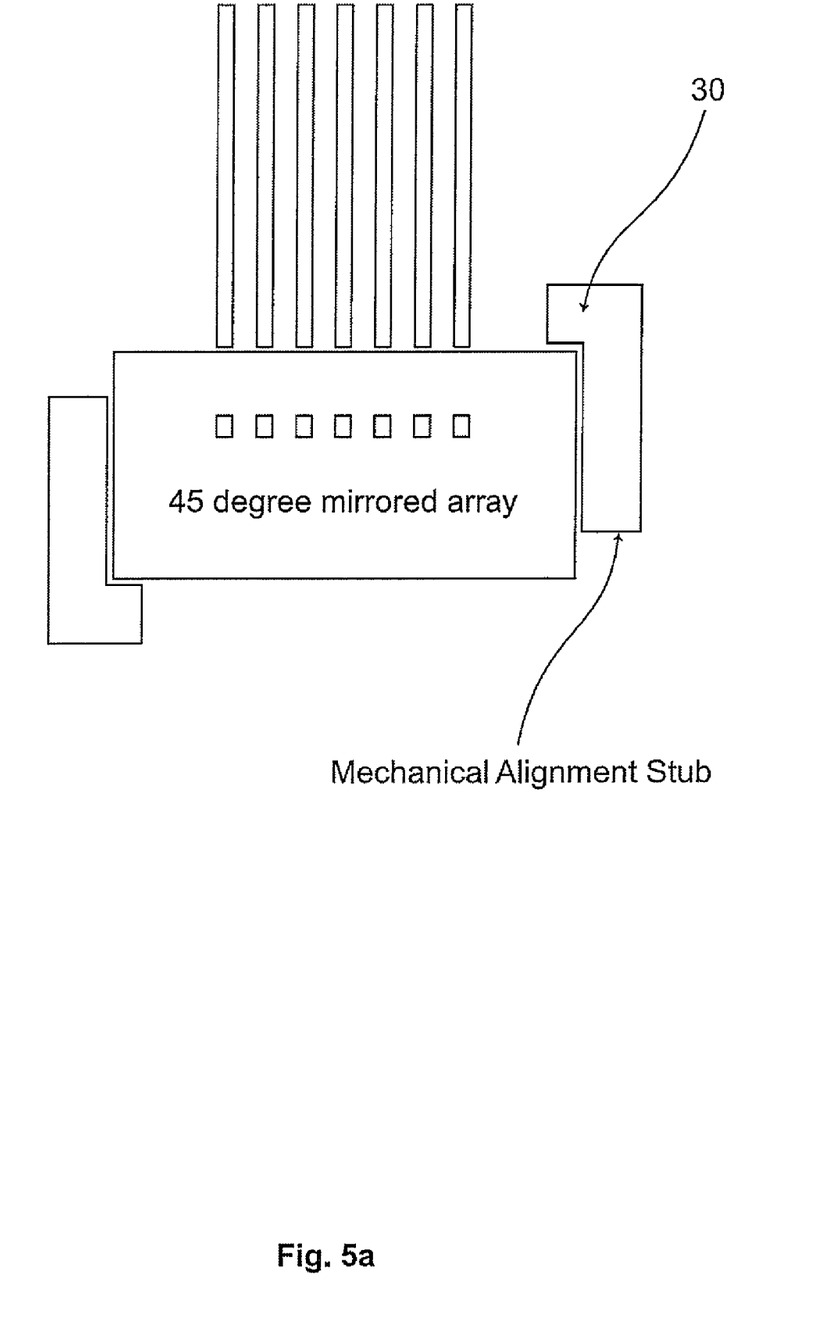
FIG. 5 shows a selection of schematic representations of generic optical processing devices for use in the optical circuit board of FIG. 4.
Figure 5B:
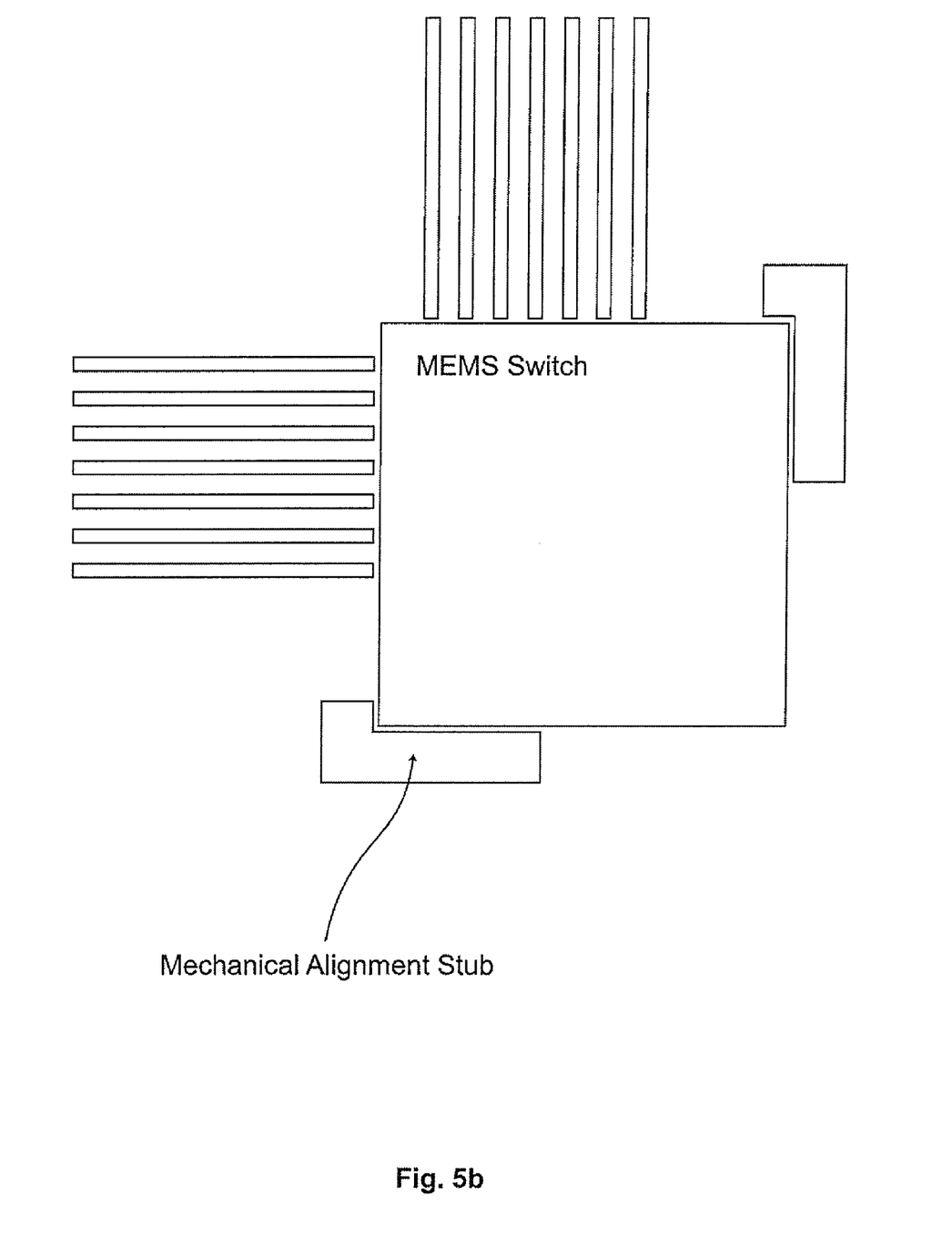
Figure 5C:
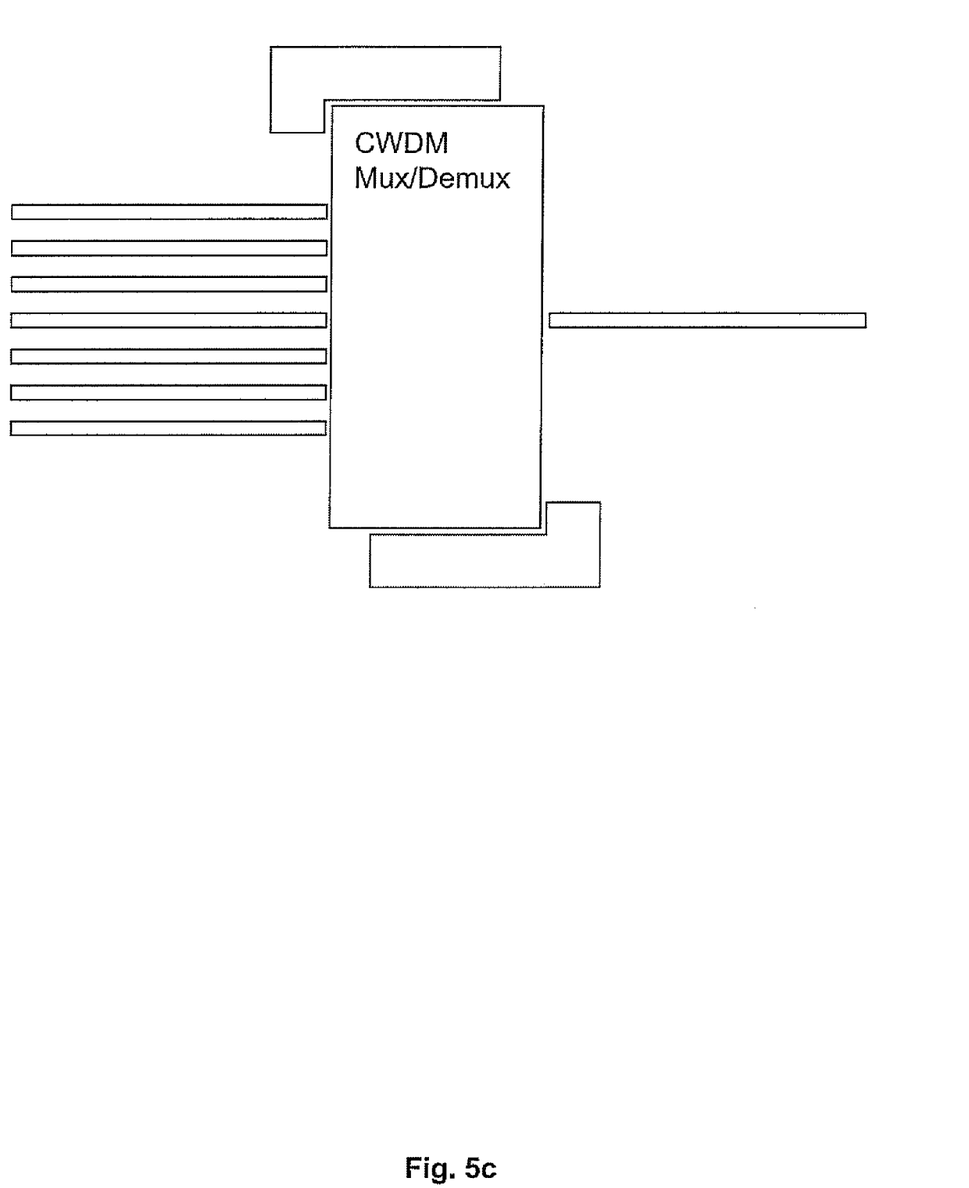
Figure 5D:
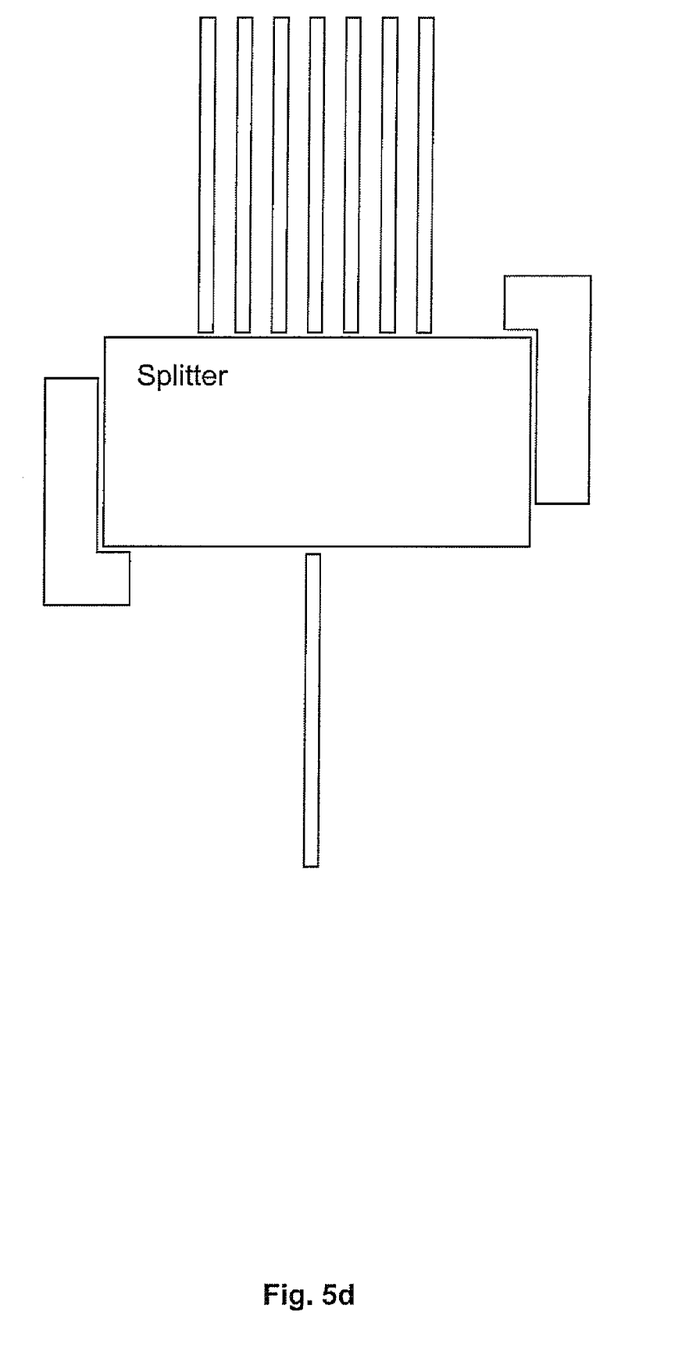

FIGS. 5A to 5D show schematic representations of passive optical devices suitable for insertion into the sockets 18 formed on the optical printed circuit board. In FIG. 5A, the device shown is a 45% mirrored array. In FIG. 5B, the device shown is a Micro Electro Mechanical Systems (MEMS) switch. Micro Optical Electro Mechanical Systems (MOEMS) may also be used. In FIG. 5C, the device shown is a course wavelength division multiplexed/demux device and in FIG. 5D, the device shown is an optical splitter.

In each of the examples shown in FIG. 5, alignment features 30 are provided. Preferably, the alignment features 30 are formed of optical material from which the optical waveguide layer is formed. Preferably, the alignment features 30 are formed during formation of the optical waveguides. This will ensure that the relative positioning of the alignment features and the optical waveguides can be accurately ensured. Any suitable configuration may be used for the alignment features. For example, although in FIGS. 5A to 5D the alignment features are shown as alignment stubs defining opposite corners of rectangles for the positioning of the passive optical components, in practice, any suitable format may be selected for the alignment features.

Preferably the alignment features have tapered or sloping sides, i.e. sides that at least in part are not vertical with respect to the layer on the circuit board blank on which they are formed. This enables the alignment features to provide a guiding function such that the optical device is guided into its final position by engagement with the alignment features or with the sloping side of the alignment features. This enables manual positioning of the optical device such that formation of the optical printed circuit board can easily and accurately be achieved.

The sloping of the sides is a consequence of the manufacturing process with lithographically patterned waveguides. Other waveguide manufacturing processes exist, such as photolithography, laser ablation, hot embossing, photo-bleaching and reactive ion etching, which would also be used. Some of these processes produce non-sloping sides, which would also function.

Figure 6A:
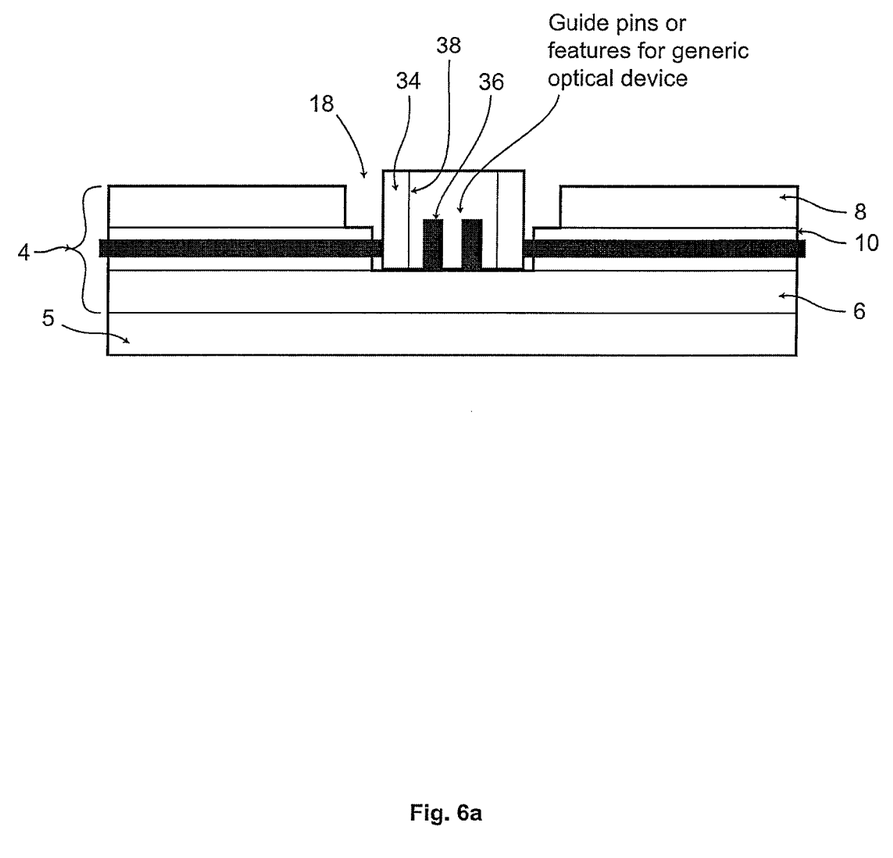
FIGS. 6a and 6b show respectively a section through an optical printed circuit board and a plan view of an optical printed circuit board blank; and, FIG. 7 shows a schematic representation of a socket or housing for use in the blank of FIGS. 6a and 6b.
Figure 6B:
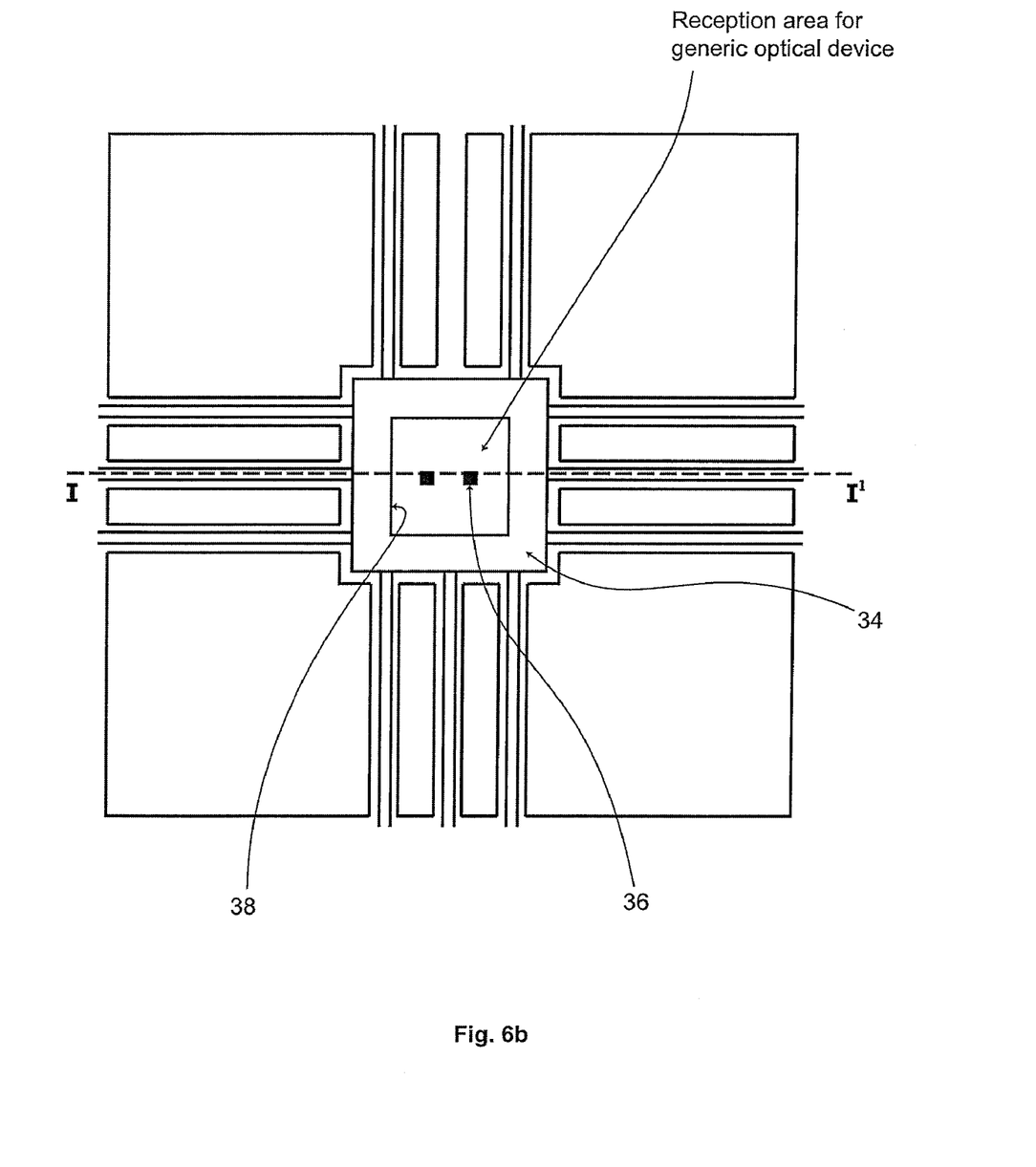

FIGS. 6A and 6B show a schematic representation of a further embodiment. FIG. 6B shows a plan view of an optical printed circuit board and FIG. 6A shows a cross-section along the line I I' of FIG. 6B. As in the example shown in and described with reference to FIGS. 3A and 3B, in this example the optical printed circuit board comprises a polyimide flexible support layer 5 on which is formed an optical layer 4 having an upper and lower cladding layer 8 and 6 respectively, and an optical core layer 10 from which one or more optical waveguides are formed. A socket 18 is formed on the optical printed circuit board in which is arranged an internal socket or housing 34. The internal socket 34 is preferably fixedly mounted to the lower cladding layer 6.

Guide means 36 are formed as part of the inner socket 34. The guide means 36 may take the form of any suitable means for guiding an optical component within the inner socket 34. In the example shown, the guide means comprises a pair of guide pins 36 which may be MT pins. Guide means may also be provided as splines, keys or recesses formed on an inner wall 38 of the inner socket 34.

In use, the optical circuit board and the inner socket 34 are arranged for receiving an optical device as described above with reference to any of FIGS. 1 to 5. The arrangement of FIG. 6A and FIG. 6B is particularly preferable as it enables a pluggable arrangement for optical components to be provided. In other words, the inner socket or housing 34 incorporating alignment pins or any other suitable form of alignment means is itself fastened and glued down to the optical printed circuit board but it allows generic optical components to be plugged in and out as a user requires. Thus, a further level of flexibility and practicality is provided since components are easily replaceable on the optical printed circuit board. The alignment of the pins 36 (or any other suitable alignment means) with respect to the inner dimensions of the inner socket or housing 34 are such that when an optical device is plugged into the socket 34, an input/output interface of the optical device will be suitably aligned with the optical waveguides 10 and appropriately formed openings or interfaces within the walls of the socket 34.

Figure 7:
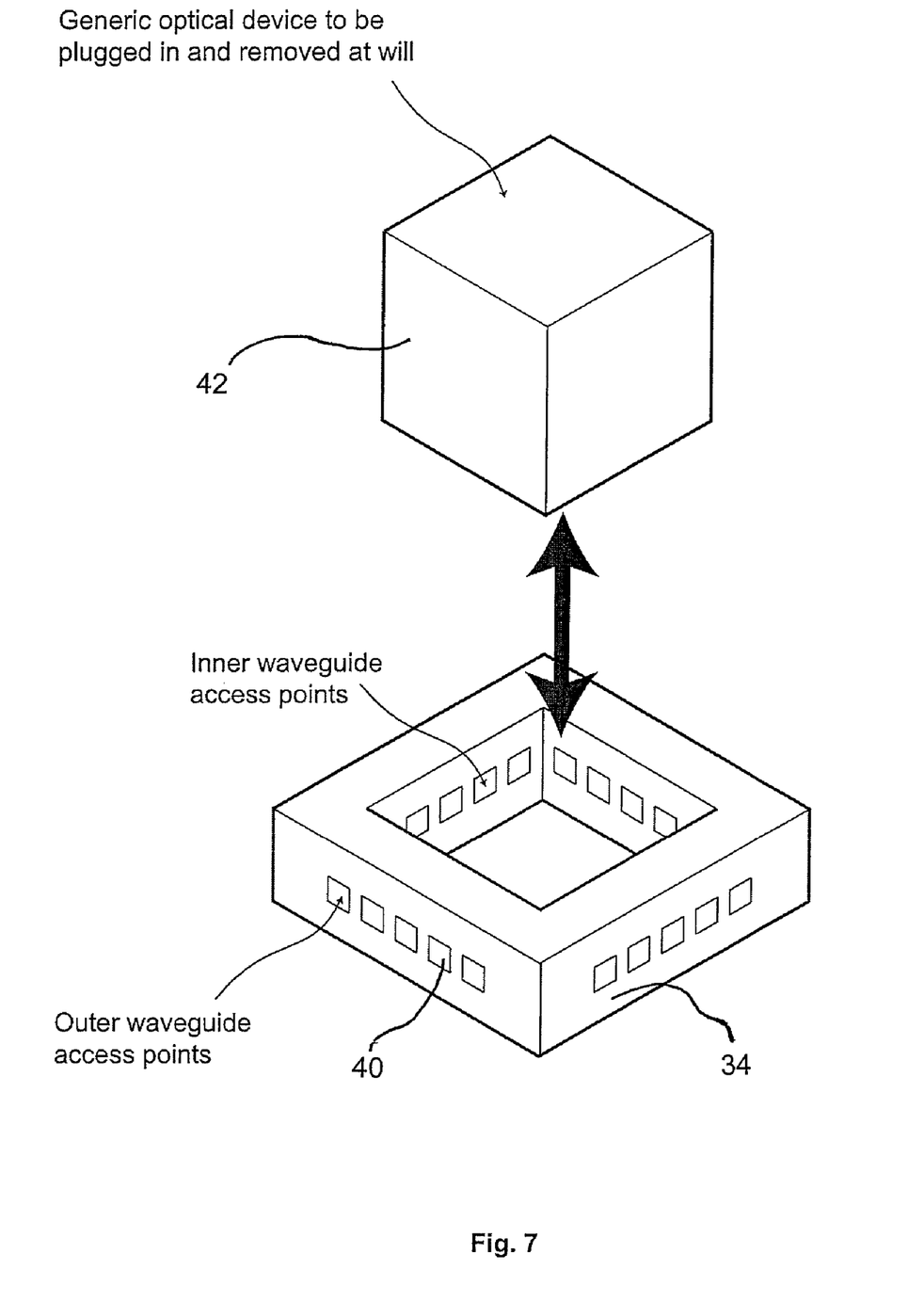

Referring to FIG. 7, an example of the inner socket or housing 34 is shown. In this example, plural waveguide access points 40 are formed that enable optical communication between the outside and the inside of the socket 34. The waveguide access points 40 may be formed as channels that pass through an appropriate wall of the housing 34. Optical control devices such as GRIN lenses etc. may be provided at one or more of the ends or along the channels 40. In FIG. 7, a generic optical device for plugging in and out of the socket 34 is shown schematically as component 42.

In another embodiment, some alignment means such as the alignment features 30 shown in FIGS. 5A to 5D may perform the function of the socket 34. In other words, a selectively reconfigurable optical circuit board blank may be provided without the socket 34. The opening 18 on the printed circuit board blank may perform the function of the socket 34.

Embodiments of the present invention have been described with particular reference to the examples illustrated. However, it will be appreciated that variations and modifications may be made to the examples described within the scope of the present invention.

The invention claimed is:

1. An optical printed circuit board blank, comprising:
a support layer;
one or more optical waveguides formed thereon; and
at least one socket for receiving an optical component, the socket including one or more alignment features formed on the support layer to ensure alignment of an input/output interface of the said optical component when arranged in the socket with an input/output interface of the at least one waveguide wherein the alignment features are formed of the same material from which the optical waveguides are formed; and
a flexible optical connector arranged at an edge of the circuit board, the optical connector being optically connected to the or each of the sockets, to enable optical communication between an optical component located within the or each of the sockets and the optical connector.

2. An optical printed circuit board blank according to claim 1, comprising plural of said sockets arranged with respect to the waveguides such that when an optical component is arranged within each of the sockets, optical communication between the said optical components is enabled.

3. An optical printed circuit board blank according to claim 1, wherein the support layers includes one or more electrically conductive layers.

4. An optical printed circuit board blank according to claim 1, wherein the one or more alignment features is or are formed to guide an optical device into a desired position on the optical printed circuit board.

5. An optical printed circuit board blank according to claim 1, comprising a housing fixedly mounted within the socket, for receiving the said optical component.

6. An optical printed circuit board blank according to claim 5, in which the housing has alignment features for engagement with an optical component.

7. An optical printed circuit board blank according to claim 6, in which the alignment features of the housing comprise one or more of pins, slots, splines, keys and recesses.

8. A kit for assembly of an optical printed circuit board, the kit comprising:
an optical printed circuit board blank according to claim 1; and
one or more optical components for selectively arranging in the sockets of the optical circuit board blank in accordance with a desired functionality of the optical printed circuit board.

9. A kit according to claim 8, wherein the one or more components comprises a selection from the group consisting of a passive optical device, an active optical device, optical routers, optical splitters, wavelength division multiplex add-drop multiplexers/demultiplexers, MEMS and MOEMS based switches.

10. A method of making an optical printed circuit board, the method comprising:
providing an optical printed circuit board blank according to claim 1;
selecting optical devices for insertion in the or each of the sockets in accordance with desired functionality of the optical circuit board; and
positioning the or each of the optical devices in a respective socket and aligning the devices within the input/output optical interfaces of the one or more optical waveguides using the alignment features within the respective socket (s).

11. A method according to claim 10, wherein the optical devices are positioned and aligned manually within the or each of the sockets.

12. An optical printed circuit board blank according to claim 1, wherein the alignment features have tapered or sloping sides for performing a guiding function to guide an optical device into position on the optical printed circuit board.

* * * * *